United States Patent
Iwashita

(10) Patent No.: US 6,654,715 B1
(45) Date of Patent: Nov. 25, 2003

(54) APPARATUS, METHOD, AND STORAGE MEDIUM FOR VERIFYING LOGICAL DEVICE

(75) Inventor: Hiroaki Iwashita, Kanagawa (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 09/309,584

(22) Filed: May 11, 1999

(30) Foreign Application Priority Data

Dec. 17, 1998 (JP) .......................................... 10-358695

(51) Int. Cl.[7] .............................................. G06F 17/50
(52) U.S. Cl. ................................. 703/22; 703/14; 716/5
(58) Field of Search ............................... 703/2, 14, 22, 703/20, 28; 716/5

(56) References Cited

U.S. PATENT DOCUMENTS

| | | | | |
|---|---|---|---|---|
| 5,461,573 A | * | 10/1995 | Chakradhar et al. | 364/489 |
| 5,615,137 A | * | 3/1997 | Holzmann et al. | 364/578 |
| 5,831,853 A | * | 11/1998 | Bobrow et al. | 364/191 |
| 6,141,633 A | * | 10/2000 | Iwashita et al. | 703/15 |
| 6,154,801 A | * | 11/2000 | Lowe et al. | 710/119 |

OTHER PUBLICATIONS

Ramin Hojati, et al., "Efficient ω–Regular language Containment," *Proceedings of 3rd International Conference on Computer–Aided Verification*, (CAV'92), Lecture Notes in Computer Science, vol. 575, by K. G. Larsen, A. Skou (Editor), Paperback (Jun. 1922) Springer Verlag; ISBN: 0387551794.

U.S. patent application Ser. No. 09/031,209, Hiroaki Iwashita, filed Feb. 26, 1998.

* cited by examiner

*Primary Examiner*—Samuel Broda
*Assistant Examiner*—Thai Phan
(74) *Attorney, Agent, or Firm*—Staas & Halsey LLP

(57) ABSTRACT

First, a graph of a set of transition sequences representing the property to be satisfied by a finite state machine which is a model of a logical device. Then, a node to be processed is selected from the graph, and one of the branches connected to the node is selected. A mapping operation is performed on a set of states of the node on the starting side of the selected branch, and the result is added to the set of states of the node on the ending side. As a result of the mapping operation, it is determined whether or not the set of states which satisfies the target property has been obtained, that is, whether or not an example of a transition sequence has been successfully detected. If it has been successfully detected, then it is assumed that there is a transition sequence, the process terminates. If it has not been successfully detected, then it is determined whether or not there is an unprocessed branch connected to the node. If yes, the above described process is repeated. If not, then it is assumed that there are no transition sequences, and the process terminates.

21 Claims, 16 Drawing Sheets

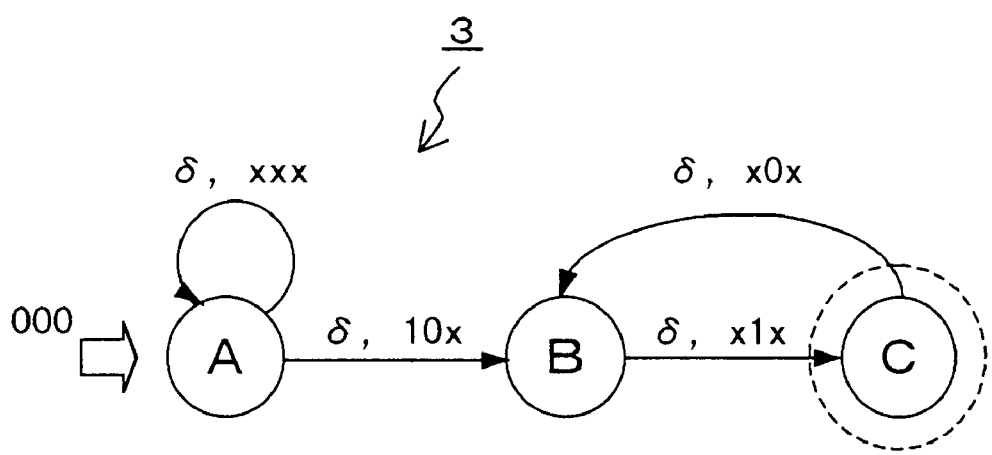
F I G. 3

4

| | A | B | C |
|---|---|---|---|
| 0 | ○ ○ ○ | | |
| 1 | | | |
| 2 | | | |
| ⋮ | | | |

F I G. 9

| 0 | (A, A, 0) |
|---|---|
| 1 | (A, B, 0) |
| 2 | |
| ⋮ | |

FIG. 11

```
CheckGraph(GRAPH REPRESENTATION OF SET OF TRANSITION SEQUENCES (G){
    INITIALIZING STATE SET LIST AND EVENT LIST ;
    while(EVENT LIST IS NOT EMPTY){
        RETRIEVING ONE SET AS (X, Y, i)FROM EVENT LIST ;
        if(X IS CIRCULATION NODE) j ← i+1
        else j ← i ;
        Y_j' ← Y_j ∪ UEvaluate(X, Y, i) ;
        if(Y_j' ⊃ Y_j){
            Y_j ← Y_j' ;
            if(CycleIsFound(Y, j) = "true")
                return "found" ;
            foreach(Y, Z, j) in SET OF BRANCHES FROM NODE Y {
                ENTERING (Y, Z, j)IF IT HAS NOT BEEN ENTERED IN EVENT LIST ;
            }
        }
    }
    return "not found" ;
}
```

F I G. 1 2

```
Evaluate(NODE X, Y ; INDEX i ) {
    F ← MAP LABELLED ON BRANCH (X, Y) ;
    Q ← X_i ;
    return F (Q) ;
}
```

FIG. 13

```
CycleIsFound(NODE X ; INDEX i ) {
    if(X IS CIRCULATION NODE AND i ≥1){
        Q ← ⋃ X_k ;
            k≥i for k= i −1 downto 0{
            if(X_k ⊆ Q)return "true" ;
            Q←Q ∪ X_k;
        }
    }
    return "false" ;
}
```

F I G. 14

APPARATUS, METHOD, AND STORAGE MEDIUM FOR VERIFYING LOGICAL DEVICE

BACKGROUND OF THE INVENTION

1. Field of the Invention

The present invention relates to an apparatus and method for verifying a logical device for use in verifying all units which can be modelled as a finite state machine, for example, a sequential circuit and a protocol.

2. Description of the Related Art

A model check is well known as a method for verifying whether or not the design of a sequential circuit and a protocol satisfies the properties required for them. This method mathematically proves that a finite state machine satisfies or does not satisfy the property represented by a temporal logic.

A general form of a finite state machine can be represented by $M=(Q, \Sigma, \Phi, \delta, \lambda, I)$.

Each of the symbols has the following meaning.

Q: set of states (finite)

$\Sigma$: input alphabet (finite)

$\Phi$: output alphabet (finite)

$\delta$: transition relation function $\lambda$: output relation function

I: initial set of states

The transition relation function is a function set to 1 if the current state can be transient to the next state when the current state, the next state, and an input are entered, and otherwise set to 0. Although the transition relation function is a function for determining the next state, it is also able to represent a nondeterministic transition in which the next state cannot be uniquely determined by a current state and an input. When the transition is deterministic, the state transition can be represented as a function for obtaining the next state by the current state and an input. The above described output relation function similarly corresponds to the case where an output is nondeterministic.

Basically, all sequential circuits can be modelled as finite state machines. Therefore, when a logical device is designed, the finite state machine is popularly used as specification. For example, in synthesizing a logic, specification of a device is described by design description language. The description is converted by a synthesizing system to a finite state machine. Then, a state is realized by a flip-flop circuit or a register, and a transition relation function 6 and an output relation function $\lambda$ are realized by a combinational circuit.

The basic theory of the above described finite state machine is described in detail in chapter 2 of the reference document 1. In verifying a logical device, it is checked whether the operation of the logical device in the time sequence satisfies a required property. An applicable technology to attain the verification can be logical simulation and a model check.

The above described logical simulation is a process of simulating an operation by applying an appropriate input to a model of a device (description in design description language, gate level circuit chart, etc.). It is confirmed that an obtained operation satisfies the property.

A model check refers to an approach in which a logical device is modelled as a finite state machine or a network of a plurality of finite state machines, and it is mathematically determined whether or not the model satisfies the property.

The model check is described in detail in the special articles (reference documents 2, 3, 4, 5, and 6 described later) in the Information Processing in September in 1994.

At present, the most practical model checking method is a symbol model checking method (refer to the reference documents 7 and 8 described later). In the symbol model checking method, the operation of the finite state machine is represented by a logical expression, and the verification procedure is realized by a logical function process. At this time, a logical function is represented by a binary decision diagram (BDD) (refer to the reference documents 9, 10, 11, 12, and 13 described later). To operate a finite state machine having an enormous number of states, an implicit expressing method using a logical function and an efficient logical function process using BDD are indispensable.

FIG. 1 shows the conventional technology, that is, an example of the finite state machine. In the above described model checking method, the symbol model checking method represents a logical device model of the Kripke structure using a logical function, checks whether or not a non-empty set of states which satisfies the specification represented by a computation tree logic exists.

The Kripke structure is a kind of nondeterministic finite automaton represented by the following equation using the finite set S of states, the transition relation R of states, the set Si of an initial state point, and the set L of a source proposition which is true in each state.

$$K=(S, R, Si, L)$$

The computation tree logic is a kind of a temporal logic, and is represented by an operator A indicating 'universal', an operator E indicating 'existential', a temporal operator F indicating 'future', a temporal operator G indicating 'global', a temporal operator X indicating 'next', and a temporal operator U indicating 'until' in addition to a common logic operator.

For example, the temporal operator AGa indicates that the logical expression a exists in the set of states reachable from the initial state. In this case, in a model of a logical device, all paths reachable from the initial state are traced, and it is checked whether or not all the paths can reach the state in which the logical expression a exists.

That is, the verifying operation in the symbol model checking method is an operation of tracing the state transition of the Kripke structure and confirming whether or not the computation tree logic indicating the specification exists in each state. This operation performs a set reduction operation for obtaining the smallest fixed point or the largest fixed point in a model according to a computation tree logic expression.

The above described set operation can be realized by combining an image computation Image($\{q\}$) for obtaining a set of states reachable from a state set $\{q\}$ in one state transition process with an inverse image computation Imagerev($\{q\}$) for obtaining a set states reachable to a state set $\{q\}$ in one state transition process.

For example, in the example of the finite state machine represented by a state transition between nine states $q_0$ through $q_8$ as shown in FIG. 1, examples of results of the image computation and the inverse image computation are represented by the following equations.

Image($\{q0\}$)=$\{q0, q1, q2, q3\}$

Image($\{q0, q2\}$)=$\{q0, q1, q2, q3, q5\}$

Imagerev($\{q0\}$)=$\{q0, q1\}$

Imagerev($\{q5\}$)=$\{q1, q2, q3, q4\}$

In the finite state machine shown in FIG. 1, when the temporal logic AFp using the logical expression p indicating the state q8 is verified, the image computation is sequentially repeated from the initial state q0, and it is checked whether or not all paths transient from the initial state can actually reach the state q8. When the temporal logic EFp is verified, the inverse image computation is repeated from the state q8, and it is checked whether or not there is a path reaching the initial state q8.

In a common actual symbol model checking method, a set operation is replaced with a logical function process, and the logical function process becomes more efficient by representing the logical function by a binary decision diagram (BDD).

REFERENCE DOCUMENTS

1. J. E. Hopcroft and J. D. Ullman, Introduction to Automata Theory, Languages, and Computation, Addison-Wesley Publishing Company, 1979.
2. Hiromi Hiraishi and Seiji Hamaguchi, 'Formal Verifying Method based on Logical Function Process', Information Process, vol. 35, No. 8, pp. 710–718, 1994.
3. Masahiro Fujita, Masami Yamazaki et al., 'Application of Practical Design in Formal Verifying Method', Information Process, vol. 35, No. 8, pp. 719–725, 1994.
4. Shinji Kimura, 'Formal Timing Verification', Information Process, vol. 35. No. 8, pp. 726–735, 1994.
5. Atsushi Takahara, 'Formal Verification using Process Algebra', Information Process, vol. 35, No. 8, pp. 736–741, 1994.
6. Ken'ichi Taniguchi and Atsushi Kitamichi, 'Specification Description, Design, and Verification in Algebraic Method', Information Process, vol. 35, No. 2, pp. 742–750, 1994.
7. J. R. Burch, E. M. Clarke, K. L. McMillan, D. L. Dill, and L. J. Hwang, 'Symbolic Model Checking: $10^{20}$ States and Beyond', Information and Computation, vol. 98, No. 2, pp. 142–170, 1992.
8. K. L. McMillan, Symbolic Model Checking, Kluwer Academic Publishers, 1993.
9. R. E. Bryant, 'Graph Based Algorithm for Boolean Function Manipulation', IEEE transactions on Computers, vol. C-35, No. 8, pp. 677–691, 1986.
10. Nagisa Ishiura, 'What is BDD?', Information Process, vol. 34, No. 5, pp. 585–592, 1993.
11. Shin'ichi Minato, 'BDD Processing Technology on Computer', Information Process, vol. 34, No. 5, pp. 593–599, 1993.
12. Etsuo Watabe and Yuji Kukimoto, 'Application of BDD', Information Process, vol. 34, No. 5, pp. 600–608, 1993.
13. Masahiro Fujita, Edmund M. Clarke, Application of BDD to CAD', Information Process, vol. 34, No. 5, 609–616, 1993.

An operation which can be confirmed in a logical simulation is only a result of a selected and specific input string. Therefore, when there are a large number of states, performing all operations requires a very long input string and a corresponding computation time. Actually, this is next to impossible.

Generally, since there are no mechanism of mathematically recording/adjusting confirmed operations in a logical simulation, it cannot be determined that all operations have been processed. As a result, there is no proving an operation which will not occur.

A model check mathematically covers the operations of a finite state machine. However, if there are a large number of states and a finite state machine has to correspond to complicated state transition, the operations of the finite state machine actually cannot be confirmed due to the increase in the memory requirements of the computer or the time required for computation. This appears as the problem of the scale of the BDD representing transition relation and generatd during the logical function process. The scale of a BDD can be measured by the number of nodes of the BDD. In the worst case, the scale is expanded in exponential order with respect to variables.

The Applicant of the present invention previously filed Tokuganhei 9-45114 or Tokuganhei 10-1364 with the problem of the scale of the BDD solved by dividing a set of states during the verification procedure. However, the previous inventions are intended for the verification system for a specific type of property, and is not fully applicable to practical problems.

SUMMARY OF THE INVENTION

The present invention aims at providing a method and apparatus for effectively verifying a logical device such as a sequential circuit, having a large number of states by modeling the logical device using a finite state machine, etc., while appropriately adjusting the memory capacity and computation time.

The method of verifying the logical device according to the present invention includes the steps of (a) converting a set of transition sequences of finite or infinite length representing the target property of the finite state machine which is a model of a logical device to be verified into a directed graph labelled by a transition relation function, and storing the configuration information about the directed graph in the first memory; (b) storing in the second memory a set of states belonging to each node of the directed graph; (c) reading from the second memory the set of states belonging to each node on the starting side of the directed graph, referring to the configuration information of the directed graph stored in the first memory, selecting branches to be processed in a mapping operation and then performing the mapping operation corresponding to the branches Lon the set of the read states; (d) adding the mapping operation result to the set of states belonging to each node on the ending side of the branches, and storing the results in the second memory; (e) repeating the processes above in steps (c) and (d), and verifying whether or not the logical device to be verified satisfies the target property by determining whether or not the set of transition sequences indicated by the directed graph actually has elements based on the set of states stored in the second memory.

The apparatus for verifying the logical device according to the present invention includes a first storage unit for converting a set of transition sequences of finite or infinite length representing the target property of the finite state machine which is a model of a logical device to be verified into a directed graph labelled by a transition relation function, and storing the configuration information about the directed graph in the first memory; a second storage unit for storing a set of states belonging to each node, corresponding to each node of the directed graph; a mapping operation unit for reading from the second storage unit the set of states belonging to each node on the starting side of the directed graph, referring to the configuration information of the directed graph stored in the first storage unit, selecting branches to be processed in a mapping operation and then performing the mapping operation corresponding to the branches on the set of the read states; adding the mapping operation result to the set of states belonging to each node on the ending side of the branches; and storing the results in the second memory; and determination unit for instructing the mapping operation unit to repeat the processes above, and verifying whether or not the logical device to be verified satisfies the target property by determining whether or not the set of transition sequences indicated by the directed graph actually has elements, based on the set of states stored in the second storage unit.

According to the present invention, when a mapping operation is performed on a branch, a set of states at a node on the starting side of the branch can be arbitrarily selected. The mapping operation can be flexibly performed. For example, it can be performed only on one state, a subset, etc. Therefore, the process can be performed while the memory capacity and the computation time are appropriately adjusted. In addition, since the mapping operation is performed for each directed graph, the process can terminate when a target transition sequence is detected even if the mapping operation has not been completed on all branches, thereby saving the applicable memory capacity of the logical device and the computation time. As a result, a logical device which has a large number of states and cannot be conventionally verified can be successfully verified.

BRIEF DESCRIPTION OF THE DRAWINGS

FIG. 3 shows a graph of a set S of transition relations;

FIG. 9 shows an example of a state set list;

FIG. 11 shows an example of an event list:

FIG. 12 shows a pseudo-code indicating a main routine of an algorithm according to the present embodiment;

FIG. 13 shows a pseudo-code of an Evaluate function;

FIG. 14 shows a pseudo-code of a CycleIsFound function;

DESCRIPTION OF THE PREFERRED EMBODIMENTS

Figure 2:
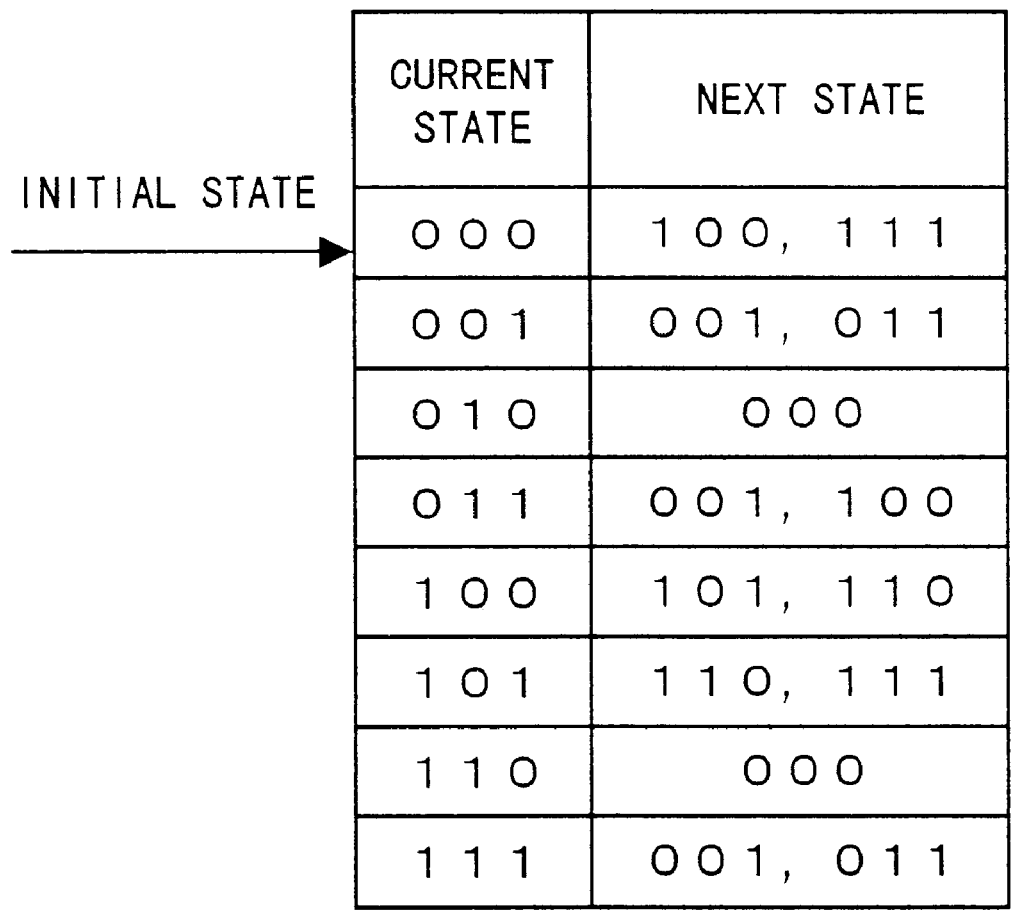
FIG. 2 shows the transition relation of the finite state machine, and illustrates an embodiment of the present invention.

FIG. 2 shows the transition relation of the finite state machine to which the embodiment of the present invention is applied.

Described below is the embodiment of the present invention as a practical example of verifying the finite state machine having the transition relation shown in FIG. 2.

In the example shown in FIG. 2, the finite state machine has a 3-bit state variable v1, v2, and v3. Hereinafter, the state of v1=a, v2=b, v3=c (a, b, c $\in \{0, 1\}$) is represented by abc. The finite state machine has eight states 000 through 111. For easier explanation, an input is omitted here, and it is assumed that the next state is selected in a nondeterministic manner. For example, if the current state is 000, the next state is 100 or 111. If the current state is 010, then the next state is necessarily 000. The initial state of the finite state machine is 000.

The finite state machine can be defined using the table shown in FIG. 2, or in a hardware description language. The transition relation of a finite state machine can be explicitly (in a table format) maintained, or implicitly (as a function) maintained using a BDD, etc.

In this example, the finite state machine shown in FIG. 2 is checked as to whether or not elements (instants) exist in the set S of transition sequences defined as follows.

S={s|s is a transition sequence of an infinite length which begins with the initial state, enters any transition states, passes the states v1=1 and V2=0, and then alternately repeats v2=1 and v2=0}. Hereinafter, such a transition sequence is referred to as a target property.

A set of transition sequences can be provided using a normal representation, an ω normal representation, an automaton or an ω automaton description using a table, a hardware description language, etc. They are described in detail in, for example, Y. Choueka, 'Theories of Automaton ω-Tapes: A Simplified Approach,' Journal of Computer and System Sciences, vol 8. pp. 117–141, 1974; or H. Iwashita and T. Nakata, 'Forward Model Checking Techniques Oriented to Buggy Design', in Proc. ICCAD-97, pp. 400–404, 1997.

FIG. 3 is a directed graph of the set S of the above described transition sequences.

The transition sequence set S can be converted into the graph representation shown in FIG. 3. The graph 3 shown in FIG. 3 contains three nodes A, B, and C; and four directed branches (A, A), (A, B), (B,C), and (C,B). Each branch is labelled with a formula defining the mapping of the state between nodes. For example, the label 'δ, 10x' on the branch (A, B) refers to an operation which selects a value satisfying v1=1 and v2=0 (v3 is arbitrarily selected) from among the reachable next states in the transition relation δ. The label 'ω, xxx' refers to all reachable next states in the transition relation δ. The starting point of a transition sequence corresponds to a node A. The sequence starting from the initial state 000 of the node A and passing a node C infinite times is an element of the transition sequence set S of the graph.

Figure 4:
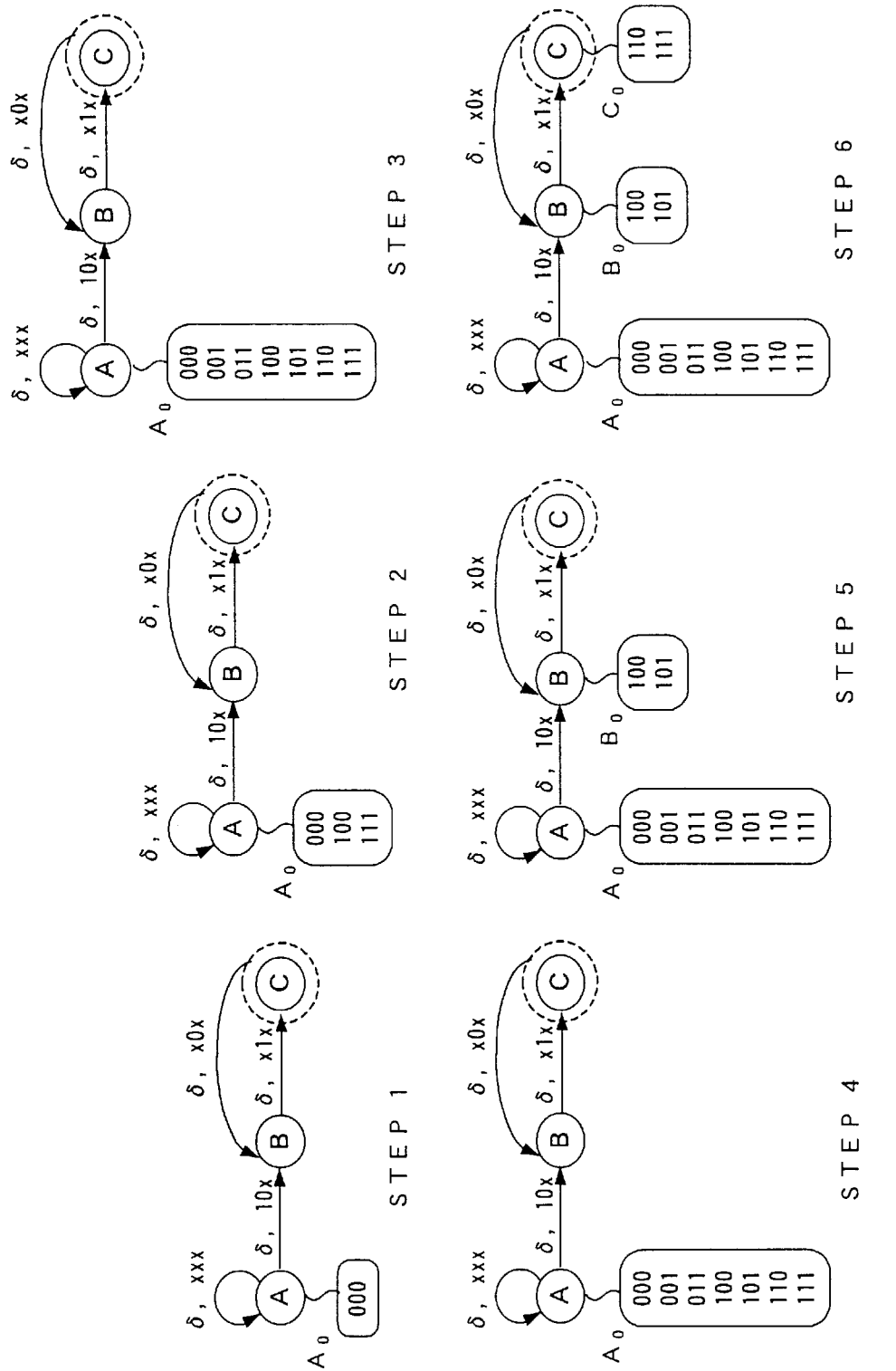
FIG. 4 shows the method (1) of performing a model check according to an embodiment of the present invention.
Figure 5:
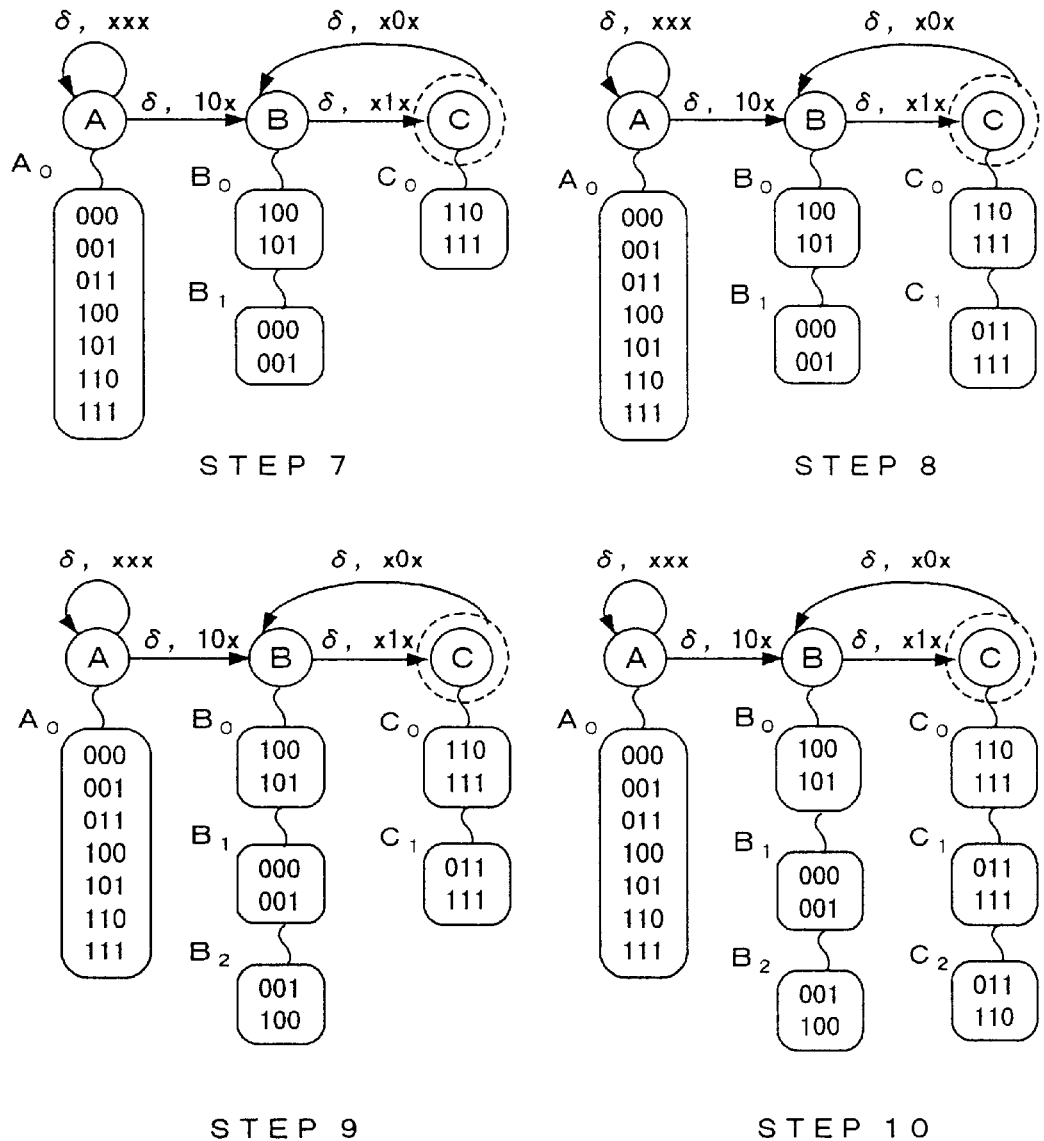
FIG. 5 shows the method (2) of performing a model check according to an embodiment of the present invention.

FIGS. 4 and 5 show the method of performing the model check according to the embodiment of the present invention.

In the data structure of the graph 3, A0 is initialized as {000} (A={000}), and an unprocess mark is assigned to the branches (A, A) and (A, B) (indicated by solid lines in the drawings (step 1)).

Figure 1:
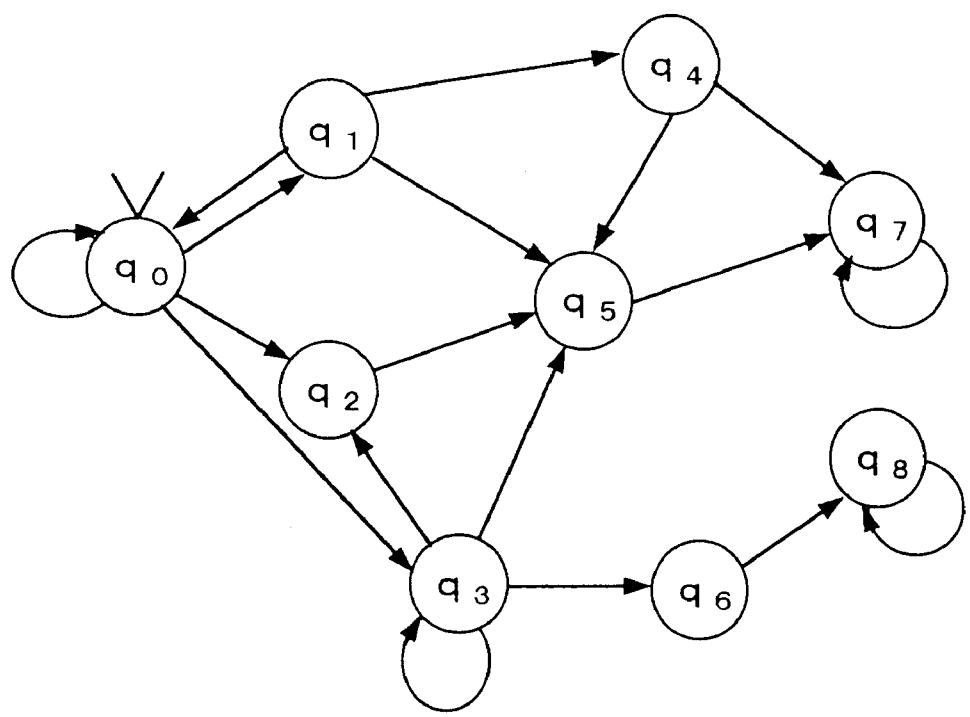
FIG. 1 shows the conventional technology.

Next, an unprocessed branch (labelled with an unprocess mark) (A, A) or (A, B) is selected for a mapping operation. If the branch (A, A) is selected and is processed in a mapping operation using the label 'δ, xxx', then {000}→{100, 111} is obtained as shown on the table in FIG. 1. If the mapping result is applied to the A0, then the element of the A0 increases, and the unprocess mark of (A, A) remains unchanged (step 2).

The branch (A, A) is selected again, the mapping operation is performed using the label 'δ, xxx' on the set of states {000, 100, 111} obtained in step 2, and the result is applied to the A0. Care should be taken such that the state already stored in the A0 is not stored again, and such that only a result not yet contained in the A0 can be applied to the A0. Thus, A0={000, 001, 011, 100, 101, 110, 111} is obtained (step 3). At this time, the mapping operation ({000, 100, 111}→{000, 001, 011, 100, 101, 110, 111}) can be performed, and only the mapping ({100, 111}→{001, 011, 101, 110}) of the increment elements in step 2 can be computed to apply the result to the A0.

When (A, A) is selected again and is processed in the mapping operation, it is proved that the elements of the A0 do not increase any more. As a result, the unprocess mark assigned to (A, A) is deleted (step 4).

At this time, since the remaining unprocessed branch is (A, B), the mapping operation is performed using the label 'δ, 10x' to obtain B0={100, 101}(step 5). That is, the mapping operation is performed on each of all elements of the A0 ({000, 001, 011, 100, 101, 110, 111}). Only the states outputting '10x' (the value of x is arbitrary, and either 0 or 1 can be selected) in the results obtained from the mapping operations are stored as the elements of the B0. At this time, the unprocess mark assigned to the (A, B) is deleted, and an unprocess mark is newly assigned to the (B, C).

The process similarly continues as described above. However, the index of the set of states is increased by 1 each time the node C is passed. (steps 7 and 9 shown in FIG. 5. That is, the set of states at the node C obtained each time the mapping operation is performed with the node C defined as the starting point is stored as another set. For example, C1 is newly added as a set of states in step 8, and C2 is newly added as a set of states in step 9.)

Having a transition sequence shown in the graph 3 is equivalent to having an integers n and m ($0 \leq n < m$) which satisfy the following equation.

$$Cn \subseteq (Cn+1 \cup \ldots \cup Cm) \qquad (1)$$

That is, the set of states Cn obtained by repeating the mapping operation repeatedly n times at the node C is contained in the sum of each set of states Cn+1, ..., Cm obtained by performing the (n+1)th through m-th mapping operations. Afterwards, when the mapping operation is performed m times after the set of states Cn appears, the Cn is contained in the sum of each set of states obtained as a result of the mapping operations. Therefore, the states contained in the Cn infinitely appear at and after the m-th time at the node C. That is, a circuit for infinite circulation is formed between the nodes B and C.

When the above described n and m are detected (a transition sequence exists), or when no unprocessed branches remain (no transition sequences any more), the process terminates.

In this example, $C0 \subseteq (C1 \cup C2)$ is true and a transition sequence exists in step 10. Therefore, since the above described transition sequence S exists in the finite state machine, the sequential circuit and a protocol modelled as a finite state machine are provided with the required properties.

In the above described examples, the mapping of all states at a node on the starting side of a selected branch is collectively computed. However, the same verification result can be obtained by selecting a state one by one or performing a divisional computation on a retrieved subset.

Figure 6:
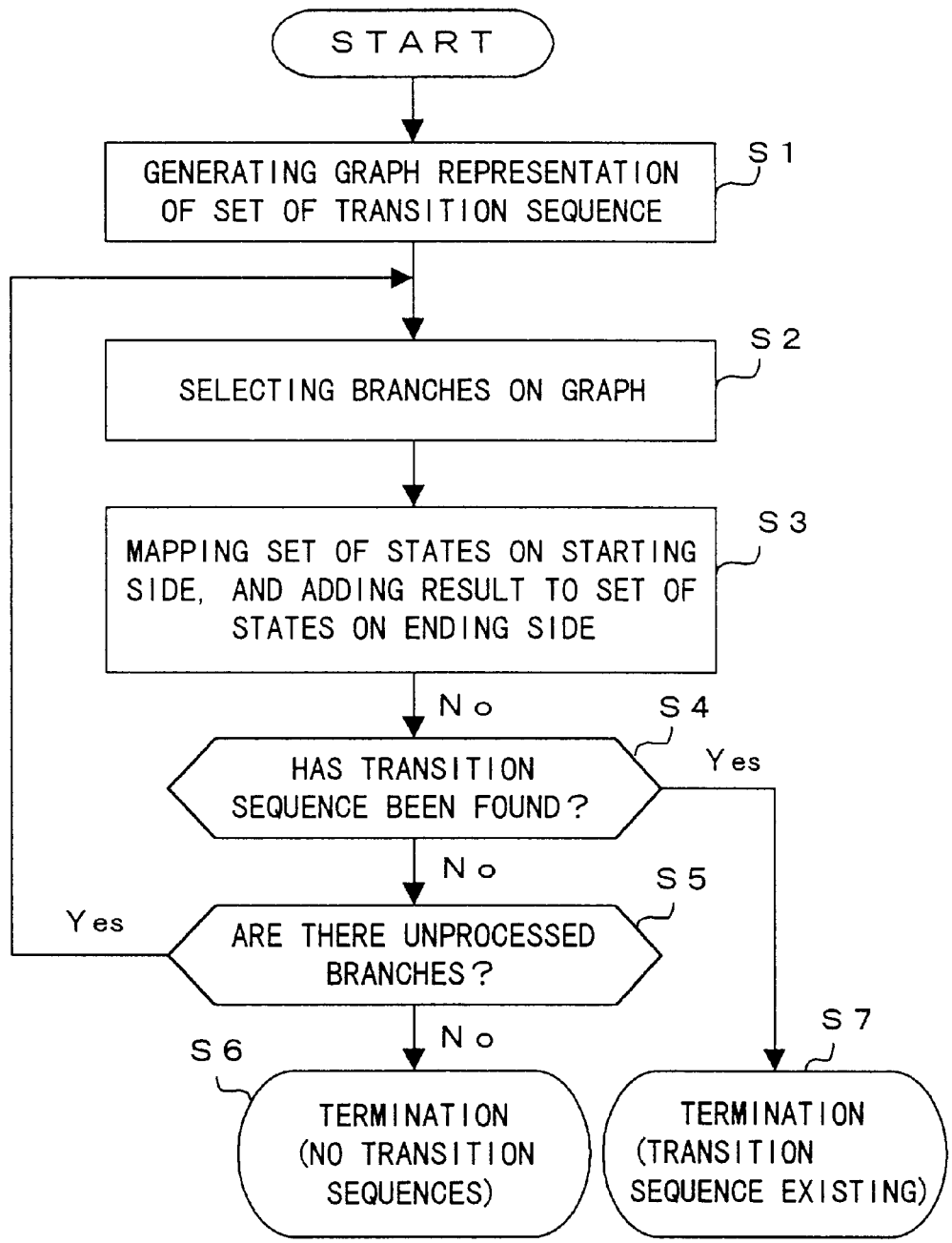
FIG. 6 is a flowchart of the process according to the first embodiment of the present invention.

FIG. 6 is a flowchart of the processes according to the first embodiment of the present invention.

Before starting the process in the flowchart shown in FIG. 6, it is assumed that the state transition relation of a finite state machine which is a model of a sequential circuit, etc. has been provided by a table or in a hardware description language as described above.

First, the a directed graph representing a set of transition sequences of a finite or infinite length is generated in step 1. The directed graph indicates the property to be satisfied by a finite state machine for verification. The node corresponds to the set of states in the finite state machine, and the nodes are connected by directed branches corresponding to a set of transitions. As described later, an area for storing one or more sets of states at each node is provided in a storage device, and each node is initialized as a specified set of states ({000} in the descriptions about FIGS. 2 through 5). Each branch is associated with a state on a starting side, a state at an ending side from a set of states, or a transition relation function defining a mapping to the set of states. The transition relation function is defined by a pointer for associating predetermined storage areas provided corresponding to the above described nodes, conditions indicating when a storage area indicating another node is to be accessed according to the pointer, the table shown in FIG. 2 for performing a mapping operation on the set of states stored in a storage area corresponding to a node, or the descriptions specifying the state transition described in a hardware description language.

Next, in step S2, a branch to be processed in the directed branches connected to a node (nodes in the directed graph are sequentially selected according to a predetermined method) on the starting side of the directed graph is selected. Then, a mapping operation is performed on a set of states belonging to the node on the starting side of the selected branches, and the result is added to the set of states on the ending side. This process is repeated (step S3). That is, the mapping operation described by referring to FIGS. 2 through 5 is performed on the selected branches in step S3. In step S4, it is determined whether or not an example of a transition sequence has been detected, that is, the case where a specific set of states enters infinite circulation transition in the loop formed by a specific one or more directed branches in the directed graph, the case where a set of states appears at a specific node after the mapping operation on a specific set of states. When no examples of transition sequences appear in step S4, it is determined in step S5 whether or not an unprocessed branch exists in the directed branches connected to the nodes currently being processed. If it is determined in step S5 that there is an unprocessed branch, then control is returned to step S2, and the processes in steps S2 through S4 are performed. If a transition sequence is detected in step S4, the process terminates (step S7). If a transition sequence is not detected and there are no unprocessed branches in step S5, then it is determined that there are no transition sequences, and the process terminates (step S6).

If a directed graph has a circuit, a new state may be added to the starting side of a branch on which a mapping operation is performed. In this case, it is assumed that the mapping operation has not been completed on the branch.

The transition sequence refers to the transition of a set of states which satisfies a target property. Therefore, the determination as to whether or not a transition sequence exists is made as follows. That is, when the target property refers to forming an infinite circulation transition in a directed graph, a set of states which circulates infinite times between the nodes B and C is detected as described by referring to FIGS. 2 through 5. If the target property indicates that a set of states should reach a predetermined node in a directed graph, then the mapping operation is repeatedly performed on the set of states in the directed graph, and it is determined whether or not any state appears at the predetermined node.

According to the first embodiment of the present invention, a model check for exhaustively checking the existence of a transition sequence is realized. Various transition sequence sets of a finite or infinite length can be checked by changing the form of a directed graph. Since the verification result does not depend on the order of selecting the branches of the directed graph, the order of selecting a branch can be changed depending on the memory capacity and the computation time.

Figure 7:
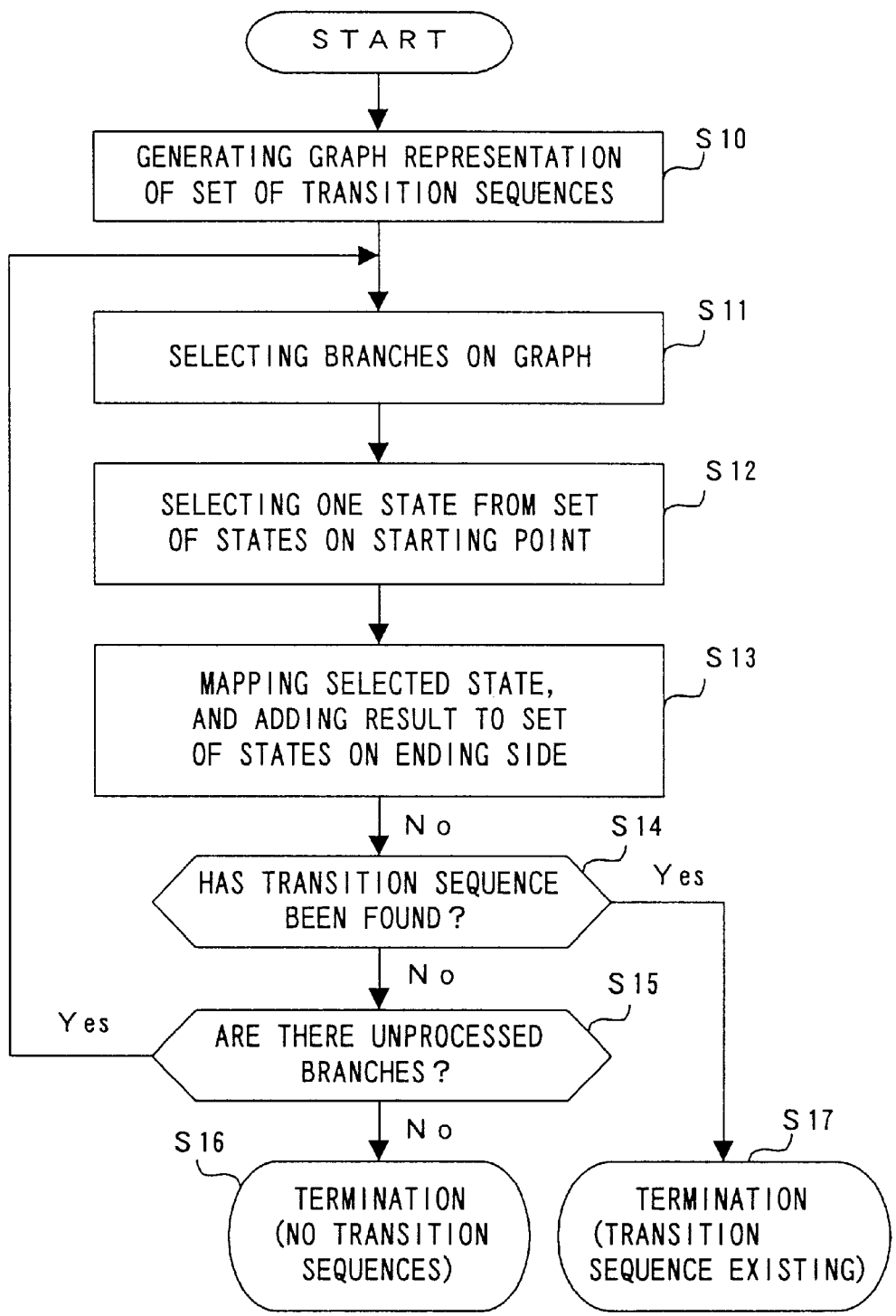
FIG. 7 is a flowchart of the process according to the second embodiment of the present invention.

FIG. 7 is a flowchart of the process according to the second embodiment of the present invention.

The second embodiment of the present invention is obtained by amending the first embodiment such that the mapping operation is performed after selecting only one state from the set of states on the starting point.

In step S10, a directed graph representation of a set of transition sequences indicating a target property as described above is generated. Next, in step S11, one of the nodes in the directed graph is selected, and a branch to be processed is selected from among the directed branches connected to the node. In step S12, one state is selected from among the states in which a node on the starting point of the selected directed branch is stored. Then, in step S13, a mapping operation is performed on the selected state, and a set of states obtained as a result of the mapping operation is stored in association with the mapped-to node. In step S14, it is determined whether or not a transition sequence has been detected. If a transition sequence exists, then control is passed to step S17, and the process terminates. If no transition sequences are detected in step S14, then control is passed to step S15, and it is determined whether or not an unprocessed branch exists in the directed branches connected to the node currently being processed. If it is determined in step S15 that an unprocessed branch exists, the processes in steps S11 through S14 are repeatedly performed. If it is determined in step S15 that no unprocessed branches exist any more, then control is passed to step S16, and the process terminates.

According to the present embodiment, step S3 is replaced with steps S12 and 13 in the first embodiment, only one state is selected from among the set of states on the starting point, and only the mapping operation on the selected state is used, thereby minimizing the requirements of the memory.

Figure 8:
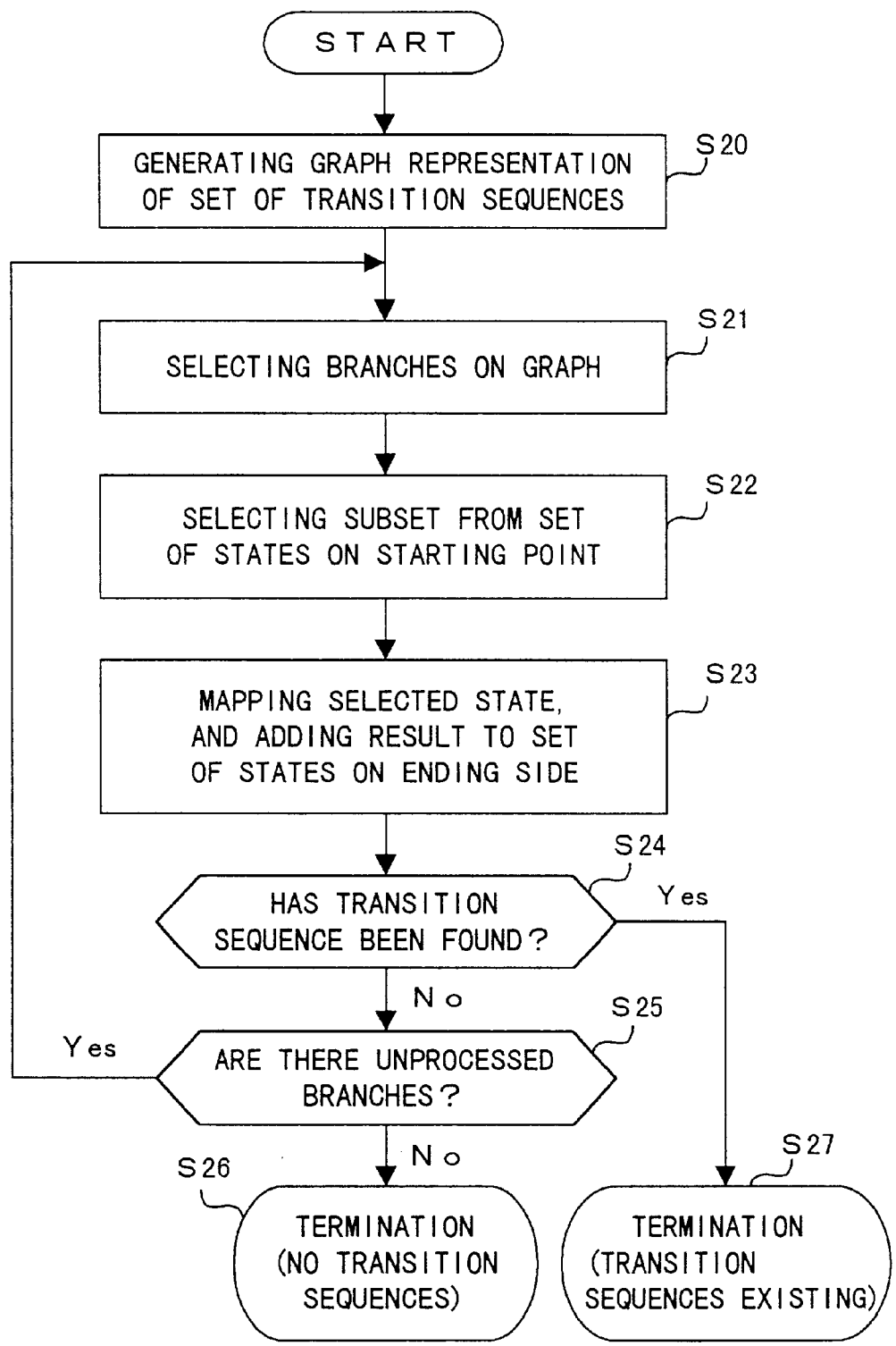
FIG. 8 is a flowchart of the process according to the third embodiment of the present invention.

FIG. 8 is a flowchart of the process according to the third embodiment of the present invention.

The third embodiment of the present invention is obtained by amending the first embodiment such that the mapping operation is performed only on a subset of an appropriate size after selecting the subset from the set of states on the starting side.

In step S20, a graph representation of a set of transition sequences indicating a target property is generated. In step S21, a node to be processed is selected. From among the directed branches connected to the node, a branch to be processed is selected in the directed graph. Then, in step S22, a set of subsets to be processed in the mapping operation is selected from the starting point of the selected directed branch, that is, from the set of states in which the node selected in step S21 is stored. In step S23, the mapping operation is performed on the selected subsets, and the result of the above described mapping operation is added to the set of states stored in the node on the ending point of the selected directed branch. In step S24, it is determined whether or not the target transition sequence has been obtained in the mapping operation in step S23. If the target transition sequence has been obtained, control is passed to step S27, and the process terminates. If it is determined in step S24 that the target transition sequence has not been obtained, control is passed to step S25, and it is determined whether or not an unprocessed branch exists in the directed branches connected to the node selected in step S21. If an unprocessed branch is detected, the processes in steps S21 through S24 are performed again. If it is determined in step S25 that an unprocessed branch is not detected, it is assumed that the target transition sequence has not been obtained. Then, control is passed to step S26, thereby terminating the process.

The third embodiment provides a new free level of adjusting the memory requirements and the computation time, which cannot be obtained according to the first embodiment, by limiting the set of states to be processed in the mapping operation in the node on the starting side of directed branches to the subset of the stored set of states.

According to the present invention, it is determined, with a finite state machine and a corresponding set of transition sequences received as input, whether or not an element of the set of transition sequences exists.

According to the embodiment of the present invention, the data structure holding the set of states corresponding to each node of the directed graph representing the above described set of transition sequences is referred to as a state set list.

Figure 9:
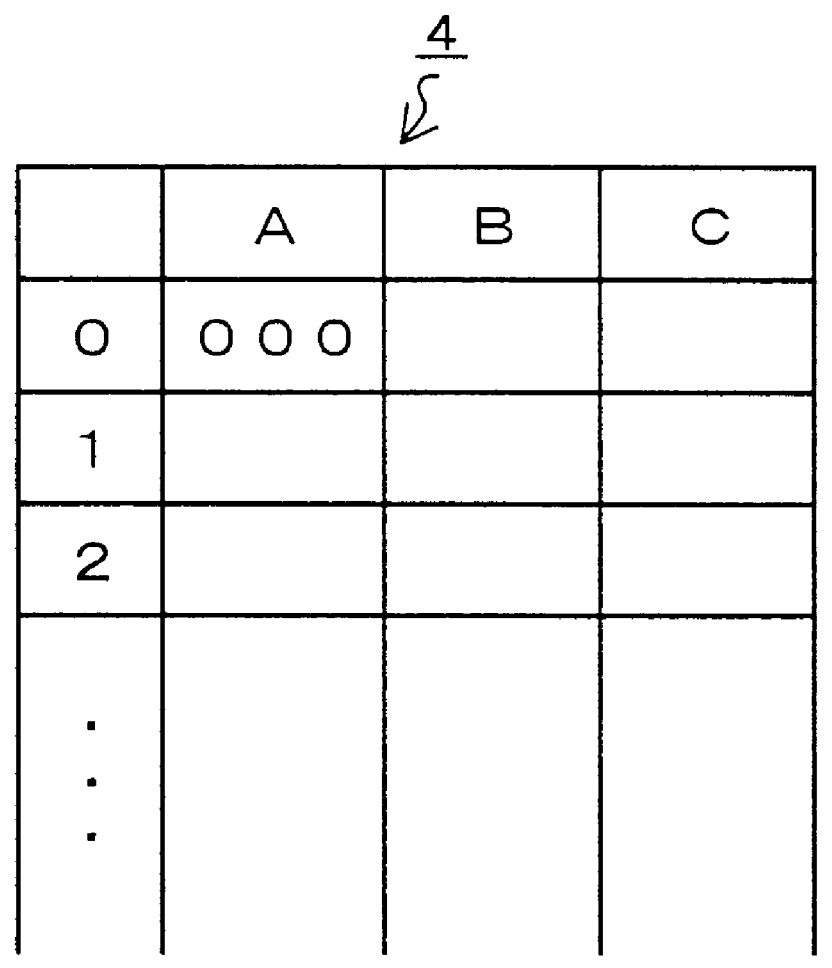

FIG. 9 shows an example of the configuration of the state set list.

In the example of the configuration shown in FIG. 9, a state set list 4 is a table comprising 3 columns. Each column stores data of the set of states of nodes A, B, and C from left to right. Each row corresponds to an index identifying a set of states. In FIG. 9, the field in the row of the index 1 and in the column A having {000} stores a set of states A0. Similarly, the field in the row of the index 2 and in the column A stores a set of states A1. The state set list 4 is designed to hold a set of states of each node for each index. Since FIG. 9 shows the states after the process in step 1 shown in FIG. 4, the state set list holds the set of states {000} only for the A0 field, and all the other fields are empty sets.

According to the present embodiment, the data structure holding a branch in a directed graph and a map having a labelled branch is referred to as a branch list.

Figure 10:
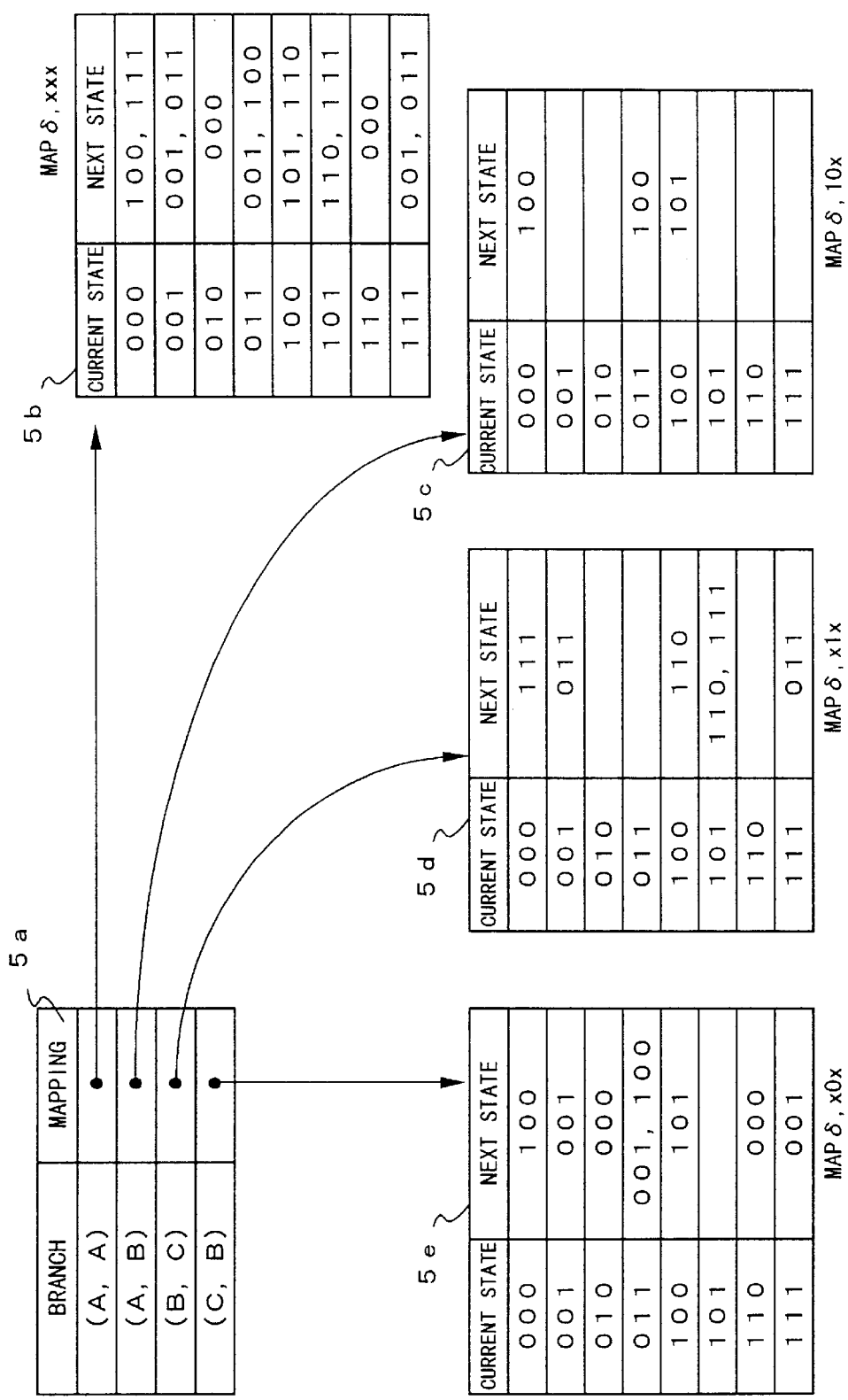
FIG. 10 shows an example of a branch list.

FIG. 10 shows an example of the configuration of a branch list.

FIG. 10 shows the state of a branch list 5 holding the graph structure shown in FIG. 3. In this example, all maps are generated from all or a part of the transition relation function 5. However, each map can generally be quite independent of each other.

As apparent from the directed graph shown in FIG. 3, directed branches (A, A), (A, B), (B, C), and (C, B) exist in the graph. For each of the branches, a mapping result (next state) corresponding to the current state is computed using an associated transition relation function $\delta$, and the relationship (transition relation) between the current state and the next state is stored in lists $5b$ through $5e$. The is mapping information lists $5b$ through $5e$ storing a registered transition relation between the current state and the next state, and a branch management list $5a$ on the upper left in FIG. 10 are linked by setting in the mapping column in the branch management list $5a$ a pointer to the corresponding mapping information lists $5b$ through $5e$. The mapping on the branch (A, A) refers to mapping all current states to any next state. Therefore, the mapping information list $5b$ contains the map $\delta$, xxx holding the same contents as the table shown in FIG. 2. The mapping on the branch (A, B) is allowed only as the state of (10x) as a mapping result of the current state. Therefore, a list of (100), (100), and (101) as the next states corresponding to the current states (000), (011), and (100) is stored as the map δ, 10x in the mapping information list 5c. Similarly, relating to the mapping on the branch (B, C), a table of the map δ, x1x shown in FIG. 10 is stored in the mapping information list 5d, and relating to the mapping on the branch (C, B), a table of the map δ, x0x shown in FIG. 10 is stored in the mapping information list 5e.

In FIG. 10, the transition relation of the finite state machine is described as a table. However, it is not always represented as a table, but can be stored using a function, etc. in a BDD, etc.

The data structure functioning as a buffer for storing an unprocess mark during a process is referred to as an event list.

Figure 11:
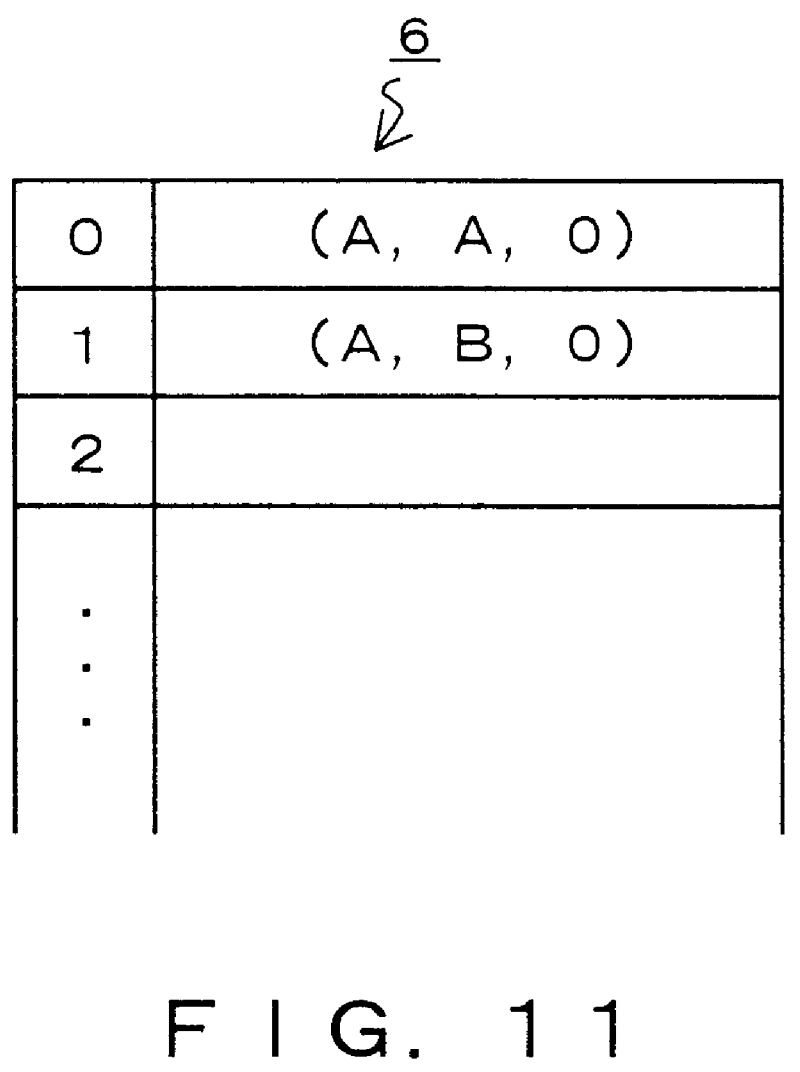

FIG. 11 shows an example of the configuration of an event list.

An event list 6 is a priority list storing, in order from highest priority, elements (data) indicating directed branches (unprocessed branches) labelled with unprocess marks containing three types of information, that is, node 1, node 2, and integer. The integer indicates the times of passing a node as described later about a pseudo-code. When an element is retrieved from the event list 6, the data with the highest priority is selected. When an element is entered in the event list 6, the element is inserted at the position determined according to any rule. In the method according to the present embodiment, an example of a correct transition sequence can be obtained regardless of the rule. FIG. 11 shows the storage of the data at the initialization in step S1. The event list 6 has entries of the branches (A, A) and (A, B) having the priority 0 and 1 respectively.

FIGS. 12 through 14 show the algorithm of the present embodiment applied to the directed graph shown in FIG. 3.

In the algorithm, a circulation node refers to a specified passage point as a condition of a transition sequence. According to the present embodiment, the node C is a circulation node. If the function CheckGraph (G) shown in FIG. 12 returns 'found', a transition sequence corresponding to the graph G exists. If it returns 'not found', such a transition sequence does not exist.

FIG. 12 shows a pseudo-code indicating the algorithm of the function CheckGraph (G).

The process shown in FIG. 12 is to determine whether or not a target transition sequence exists in the directed graph shown in FIG. 3. First, the function CheckGraph (G) which is a main routine receives as an input the graph representation G of a transition sequence set S. Then, the above described state set list 4 and event list 6 are initialized. Thus, the state set list 4 and the event list 6 are initialized as shown in FIGS. 11 and 9 respectively. Next, the following process is performed until the event list 6 becomes empty using a while statement.

Since all unprocessed branches connected to a node to be processed are entered in the initialized state in the event list 6, the process in the while statement is started. That is, one element relating to an unprocessed branch is retrieved as (X, Y, i) from the event list 6. Then, it is determined whether or not the node X is a circulation node. If it is a circulation node, i+1 is substituted for j. If the node X is not a circulation node, i is substituted for j. This operation refers to adding a set of states obtained as a result of sequential mapping to a set of states as shown by the node A shown in FIG. 4. If a mapping node is a circulation node, a set of states obtained as a mapping result is stored as another set as indicated by the node C shown in FIGS. 4 and 5. Thus, after setting the value of j, Yj'←Yj ∪ Evaluate (X, Y, i) is executed. At this time, if the node X is not a circulation node, but a first node not connected through a circulation node and a branch, then Yj indicates a sum of the set of states obtained heretofore at the node Y. On the other hand, if the node X is a circulation node or a second node connected through a circulation node and a branch, then Yj indicates an empty set. The function Evaluate receives a set of states of the node X, a set of states of the node Y, and an integer i, performs a mapping operation, and returns a set of states obtained as a mapping result.

Therefore, when the node X is the first node, a sum of a set of all states at the node Y obtained in the previous mapping operation and a set of states obtained about the node Y as a result of the latest mapping operation using the Evaluate function is substituted for Yj'. On the other hand, when the node X is the second node, the latest map is substituted as a set of states for the Yj'. Next, it is determined whether or not Yj' contains Yj in an if statement. Generally, Yj is contained in Yj'. If Yj equals Yj', the condition of the if statement is not satisfied. This proves that a new set of states has not been generated in the latest mapping operation. As a result, control is returned to the beginning of the while statement, and the process is repeated. On the other hand, if it is determined that Yj is contained in Yj' in an if statement, then a new set of states has been generated in the latest mapping operation, Yj is stored in the field of the index j of the node Y of the state set list 4 by substituting Yj' for Yj, the function CycleIsFound is called, and it is determined whether or not a set of states which infinitely circulates by a mapping operation exists at the node Y. When the return value of the function CycleIsFound is true, the set of states which infinitely circulates exists at the node Y. Therefore, 'found' is output as a return value of the function CheckGraph. If the return value of the function CycleIsFound is not true, and the set of states which infinitely circulates does not exist, then control is passed to the foreach statement. In the forearh statement, a branch (Y,Z) is selected from a set of branches from the node Y. If (Y, Z, j) is not entered in the event list 6, then it is entered in the event list 6, control is returned to the start of the while statement, and the above described process is repeated. A new entry of an element (X, Y, j) in the event list 6 is a preparation process for the mapping operation to be performed on a new node.

The above described process is practically described by referring to the cases shown in FIGS. 4 and 5. That is, if the node X is the node C, and the node Y is the node B when (X, Y, i) is retrieved from the event list 6, then the node C is a circulation node. Therefore, j is set to i+1. Yi+1 ∪ Evaluate (C, B, i) is substituted for Yi+1'. Then, it is determined whether or not Yi+1is contained in Yi+1'. At this time, if Yi+1' equals Yi+1, then the condition of the if statement is not satisfied, control is returned to the start of the while statement, and the process is repeated. On the other hand, if the if statement is satisfied, then Yj←Yj', and it is determined whether or not a set of states which infinitely circulates exists at the node C by the function CycleIsFound. If the set of states which infinitely circulates does not exist, one branch (B, C) is selected from the branch set of the node B using the foreach statement. If (B, C, i+1) is not entered in the event list 6, then it is entered in the event list 6, and control is returned to the start of the while statement. Thus, each time the node C is selected as the node X, the index of the element entered in the event list 6 is incremented by 1. Therefore, a set of states of the circulation node C obtained by the mapping on the node B is stored in the state set list 4 as another state set Yj.

FIG. 13 shows a pseudo-code of the function Evaluate.

The function Evaluate includes as input a starting node X, an ending node Y, and an index i indicating the times of circulation at a circulation node. The map (corresponding to any of the mapping information lists 5b through 5e shown in FIG. 9) labelled on the branch (X, Y) by referring to the mapping information list 5a is substituted for F. The set of states Xi at the node X to be mapped is obtained from the state set list 4 and substituted for Q. Then, the function F (Q) is returned as a return value. That is, the value of the function F (Q) obtained as a result (a set of states belonging to the node Y) of the mapping of the set of states Xi at the node X on the branch (X, Y) is returned as a function. The function F (Q) is used in the mapping operation on the set of states Xi (=Q) by referring to the mapping information lists 5b through 5e shown in FIG. 10. That is, the function F (Q) obtains a state (next state) corresponding to each state (current state) in the set of states Xi from the mapping information lists 5b through 5e, and returns the obtained value as a return value to the function Evaluate.

FIG. 14 shows a pseudo-code of the function CycleIsFound.

The function CycleIsFound includes as input a node X at which it is determined whether or not an infinitely circulating set of states exists, and an index i indicating the times of passage through a circulation node to determine whether or not an infinitely circulating transition sequence exists in the directed graph shown in FIG. 3.

First, it is determined whether or not the node X is a circulation node, and i is equal to or larger than 1. If the determining result is 'No', that is, if the node X is not a circulation node, or if i is 0, then 'false' is returned as a return value of the function. If the determination result is 'Yes', then a sum of the set of states Xk having the index k equal to or larger than i is generated and substituted for Q. Then, using the for statement, the value of k is decremented by 1 from i−1 and the following process is performed until the value of k reaches 0. That is, it is determined whether or not Xk is contained in Q. If yes, 'true' is returned as a return value of the function. If not, the loop of the for statement is repeated until the value of k reaches 0 using a sum of Q and Xk as a new Q. If Xk ∪ Q is not true even if k has reached 0, then 'false' is returned as a return value of the function. The loop process of the for statement corresponds to the evaluation as to whether or not the above described equation (1) is true. That is, when the return value of the function CycleIsFound is 'true', then it proves that a target transition sequence has been found.

Figure 15:
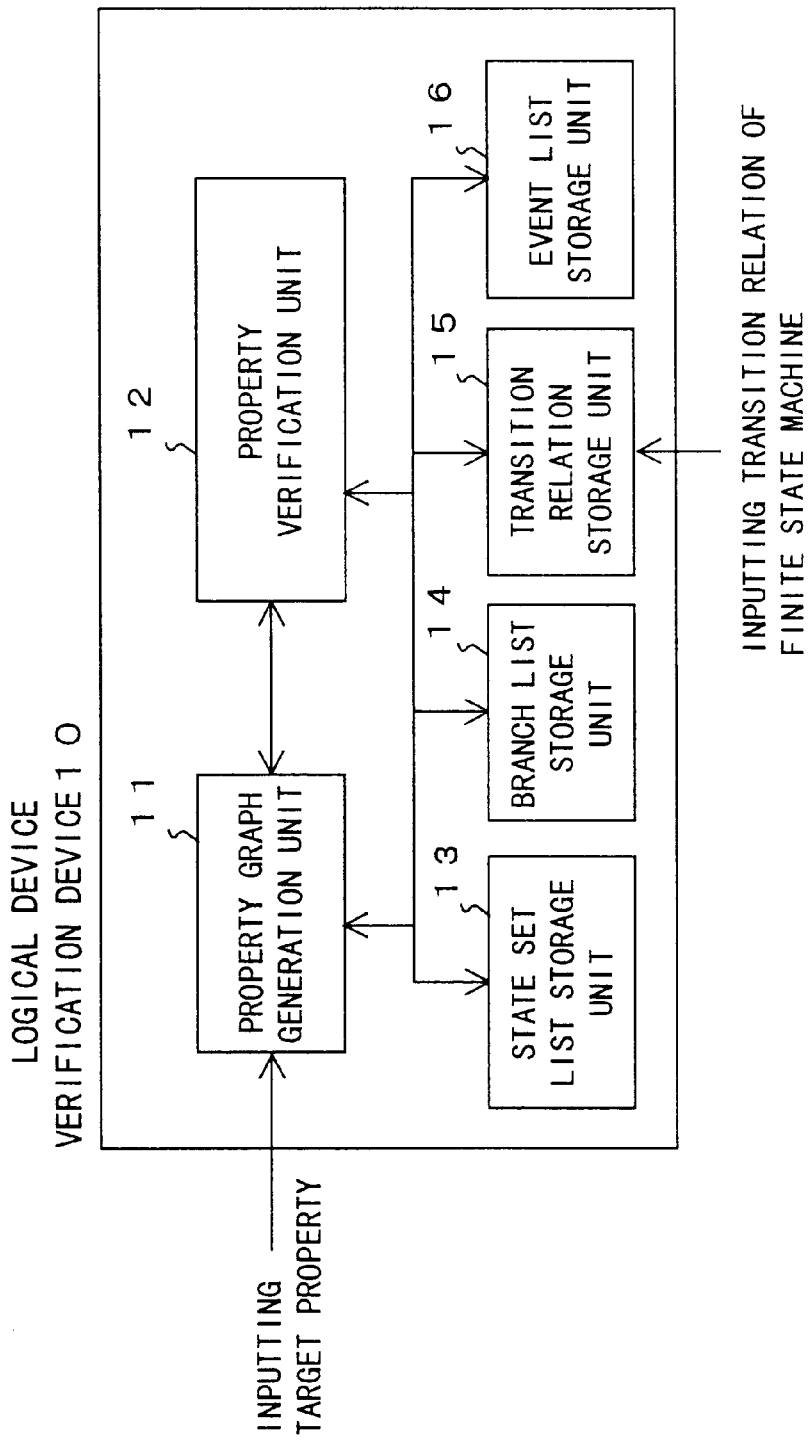
FIG. 15 shows the configuration of the logical device verification device for realizing an embodiment of the present invention.

FIG. 15 is a block diagram of the configuration of the logical device verification device for realizing the embodiment of the present invention shown in FIGS. 9 through 14.

A logical device verification device 10 according to the present embodiment comprises a property graph generation unit 11, a property verification unit 12, a state set list storage unit 13, a branch list storage unit 14, a transition relation storage unit 15, and an event list storage unit 16.

First, the transition relation of a finite state machine which is a model of a logical device such as a sequential circuit, etc. to be verified is described in a table format or in a hardware description language, and is externally input and stored in the transition relation storage unit 15. Similarly, the property (a set of transition sequences) of the finite state machine is described in a hardware description language, etc., and is externally input to the property graph generation unit 11. The property graph generation unit 11 generates a graph indicating the property from the description of the input target property. That is, first, the state set list 4 for each node is generated and stored in the state set list storage unit 13 of the generated graph. Then, by referring to the transition relation of the finite state machine stored in the transition relation storage unit 15, the branch list 5 for holding the transition relation (map) labelled on each branch of the generated graph is generated and stored in the branch list storage unit 14. The property graph generation unit 11 generates and stores the event list 6 in the event list storage unit 16.

The property verification unit 12 interprets and executes each function (program) described in pseudo-code, and starts the process at a request from the property graph generation unit 11 to verify a graph. The property verification unit 12 first initializes the state set list in the state set list storage unit 13, and the event list 6 in the event list storage unit 16. Then, it starts the process with the initial value of the state set list 4 the initial value of the event list 6, and updates the event list 6 in the event list storage unit 16 with the proceeding of the sequential process. When each node in the graph is processed in a mapping operation, it refers to the branch list 5 in the branch list storage unit 14 to perform the mapping operation of converting the set of current states of each node into a set of next states. The operations of the property verification unit 12 are similar to the algorithm of each function shown in FIGS. 12 through 14, and the detailed explanation is omitted here.

Figure 16:
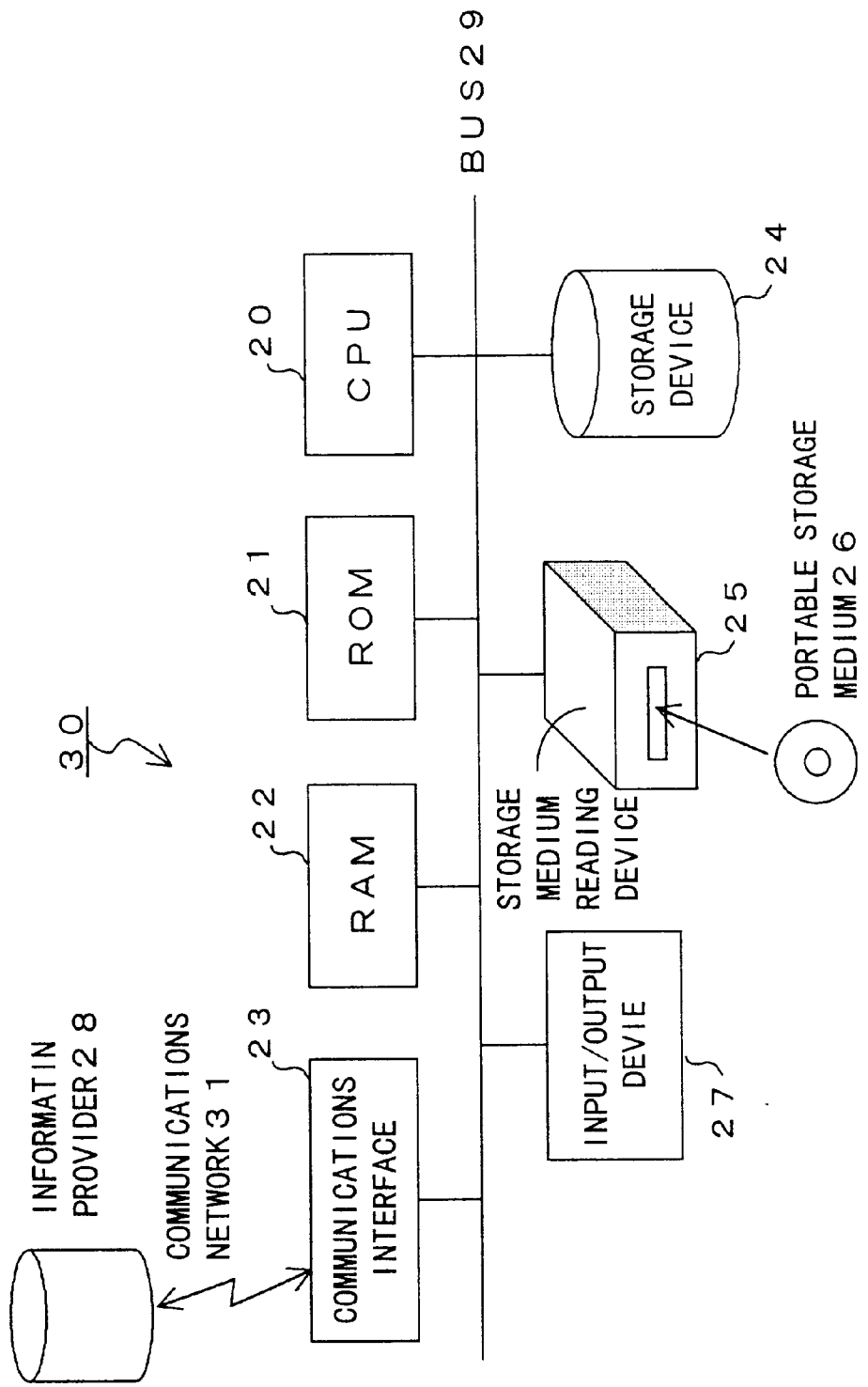
FIG. 16 shows the hardware environment of the computer required when the method for verifying the logical device is realized as a program according to the present embodiment.

FIG. 16 is a block diagram of the hardware environment of a computer 30 required when the method of verifying a logical device according to the present embodiment is realized by executing a program.

A CPU 20 can access a ROM 21 through a bus 29, reads a BIOS, etc. from the ROM 21, checks and initializes other components including an input/output device 27, and makes them operable. When the computer 30 is exclusively used for the method of verifying a logical device, the program for realizing the present embodiment can be stored in the ROM 21. A program for realizing the method of verifying a logical device according to the present embodiment is expanded in RAM 22 as an executable form for the CPU 20. The CPU 20 verifies the logical device by reading the above described program from the RAM 22. The program for realizing the method of verifying a logical device according to the present embodiment is stored in an external storage device 24 such as a hard disk, etc. and in a portable storage medium 26 such as a floppy disk, CD-ROM, etc. A storage medium reading device 25 can be provided with the portable storage medium 26, and is a drive device capable of reading the program from the portable storage medium 26.

The input/output device 27 is used to input the state transition relation of the finite state machine which is a model of a logical device to be verified, and the property of the finite state machine. The input/output device 27 comprises a keyboard, a mouse, a display, etc. A communications interface 23 communicates with an information provider 28 through the communications network 31. A program for realizing the method of verifying a logical device according to the present embodiment is loaded from the information provider 28 through the communications network 31 using the communications interface 23, temporarily stored in the external storage device 24 or the portable storage medium 26, and is then expanded in the RAM 22 to be executed by the CPU 20.

It is also possible to execute the above described program in the network environment by remote control to make the above described program executable by the computer of the information provider 28, transmit necessary input data, etc. from the computer 30 through the communications network 31, receive through the communications network 31 the result obtained by executing the above described program by the information provider 28, output the execution result to the input/output device 27, etc.

As described above, according to the present invention, a target property of a finite state machine to be verified is represented by a graph, and can be associated with a different transition relation for each branch of the graph. Therefore, the conventionally complicated problems with verification such as a problem about a cooperation among a plurality of finite state machines can be effectively solved.

In addition, since a set of states on the starting side of the mapping operation can be set as subsets of arbitrary size, thereby allowing a highly free level of trading off the memory requirements and computation time. Thus, the present invention realizes the verification on a complicated logical device whose memory requirements are beyond the limit in the conventional symbolic model checking method.

Furthermore, when an example of a transition sequence can be detected, the verification can be completed before processing all state transitions (branch).

What is claimed is:

1. A method of verifying a logical device, comprising:
   (a) converting a set of synchronous transition sequences of finite or infinite length having a target property of a finite state machine which is a model of a logical device to be verified into a directed graph labelled by a transition relation function, and storing configuration information about the directed graph in first memory;
   (b) storing in a second memory a set of states belonging to each node of the directed graph;
   (c) reading from the second memory a set of states belonging to each node on a starting side of the directed graph, referring to the configuration information of the directed graph stored in the first memory, selecting branches to be processed in a mapping operation and then performing the mapping operation corresponding to the branches on the set of the read states;
   (d) adding a mapping operation result to a set of states belonging to each node on an ending side of the branches, and storing results in the second memory; and
   (e) repeating said steps (c) and (d), and verifying whether or not the logical device to be verified satisfies the target property by determining whether or not the set of synchronous transition sequences indicated by the directed graph based on the set of states stored in the second memory actually has elements.

2. The method according to claim 1, wherein
   in said step (c), one state is retrieved from the set of states belonging to the node on the starting side stored in said second memory, and the mapping operation is performed only on the state.

3. The method according to claim 1, wherein
   in said step (c), an appropriate subset is retrieved from the set of states belonging to the node on the starting side stored in said second memory, and the mapping operation is performed only on the subset.

4. The method according to claim 1, wherein
   said mapping operation is performed by referring to a table in which a state transition relation of the finite state machine is entered.

5. The method according to claim 1, wherein
   said mapping operation is performed according to information generated from the state transition relation of the finite state machine described in a hardware description language.

6. The method according to claim 1, wherein
   the determination in said step (e) is to determine whether or not there is a synchronous transition sequence circulating infinite times through a specific node of the directed graph.

7. The method according to claim 1, wherein
   the determination in said step (e) is to determine whether or not the set of states is actually obtained as a result of the mapping operation.

8. An apparatus for verifying a logical device, comprising:
   first storage means for converting a set of synchronous transition sequences of finite or infinite length having a target property of a finite state machine which is a model of a logical device to be verified into a directed graph labeled by a transition relation function, and storing configuration information about the directed graph;
   second storage means for storing a set of states belonging to each node of the directed graph;
   mapping operation means for reading from said second storage means a set of states belonging to each node on a starting side of the directed graph, referring to the configuration information of the directed graph stored in said first storage means, selecting branches to be processed in a mapping operation and then performing the mapping operation corresponding to the branches on the set of the read states, adding a mapping operation result to a set of states belonging to the node on an ending side of the branches, and storing results in said second storage means; and
   determination means for repeating processes performed by said mapping operation means, and verifying whether or not the logical device to be verified satisfies the target property by determining whether or not the set of synchronous transition sequences indicated by the directed graph based on the set of states stored in said second storage means actually has elements.

9. The apparatus according to claim 8, wherein
   said mapping operation means retrieves one state from the set of states belonging to the node on the starting side stored in said second storage means, and the mapping operation is performed only on the state.

10. The apparatus according to claim 8, wherein
    said mapping operation means retrieves an appropriate subset from the set of states belonging to the node on the starting side stored in said second storage means, and the mapping operation is performed only on the subset.

11. The apparatus according to claim 8, further comprising state transition relation storage means for storing a table in which a state transition relation of the finite state machine is entered, wherein
    said mapping operation is performed by referring to the table stored in said state transition relation storage means.

12. The apparatus according to claim 8, wherein
    said mapping operation is performed according to information generated from the state transition relation of the finite state machine described in a hardware description language.

13. The apparatus according to claim 8, wherein it is determined whether or not there is a synchronous transition sequence circulating infinite times through a specific node of the directed graph.

14. The method according to claim 8, wherein
    it is determined whether or not the set of states is actually obtained as a result of the mapping operation.

15. A computer-readable storage medium used to direct a computer to perform a process of verifying a logical device comprising:

(a) converting a set of synchronous transition sequences of finite or infinite length having a target property of a finite state machine which is a model of a logical device to be verified into a directed graph labelled by a transition relation function, and storing configuration information about the directed graph in first memory;

(b) storing in a second memory a set of states belonging to each node of the directed graph;

(c) reading from the second memory a set of states belonging to each node on a starting side of the directed graph, referring to the configuration information of the directed graph stored in the first memory, selecting branches to be processed in a mapping operation and then performing the mapping operation corresponding to the branches on the set of the read states;

(d) adding a mapping operation result to a set of states belonging to each node on an ending side of the branches, and storing results in the second memory; and (e) repeating said steps (c) and (d), and verifying whether or not the logical device to be verified satisfies the target property by determining whether or not the set of synchronous transition sequences indicated by the directed graph based on the set of states stored in the second memory actually has elements.

16. The storage medium according to claim 15, wherein in said step (c), one state is retrieved from the set of states belonging to the node on the starting side stored in said second memory, and the mapping operation is performed only on the state.

17. The storage medium according to claim 15, wherein in said step (c), an appropriate subset is retrieved from the set of states belonging to the node on the starting side stored in said second memory, and the mapping operation is performed only on the subset.

18. The storage medium according to claim 15, wherein said mapping operation is performed by referring to a table in which a state transition relation of the finite state machine is entered.

19. The storage medium according to claim 15, wherein said mapping operation is performed according to information generated from the state transition relation of the finite state machine described in a hardware description language.

20. The storage medium according to claim 15, wherein the determination in said step (e) is to determine whether or not there is a synchronous transition sequence circulating infinite times through a specific node of the directed graph.

21. The storage medium according to claim 15, wherein the determination in said step (e) is to determine whether or not the set of states is actually obtained as a result of the mapping operation.

* * * * *